United States Patent [19]

Magel

[11] 4,284,334
[45] Aug. 18, 1981

[54] CIRCUIT ARRANGEMENT FOR THE COMPENSATION OF THE TEMPERATURE COEFFICIENT OF SEMICONDUCTOR JUNCTIONS

[75] Inventor: Rolf Magel, Fernwald, Fed. Rep. of Germany

[73] Assignee: Ernst Leitz Wetzlar GmbH, Wetzlar, Fed. Rep. of Germany

[21] Appl. No.: 38,939

[22] Filed: May 14, 1979

[30] Foreign Application Priority Data

May 20, 1978 [DE] Fed. Rep. of Germany ....... 2822035

[51] Int. Cl.$^3$ .................. G03B 7/083; G03B 7/22; G05F 3/16
[52] U.S. Cl. .................. 354/24; 354/51; 354/60 L; 307/310; 323/907
[58] Field of Search .................. 354/24, 50, 51, 53, 354/60 R, 60 E, 60 L; 307/310; 356/223, 226; 340/501; 324/105, 106; 250/214 P, 214 C; 73/362 SC; 323/22 T, 68, 69

[56] References Cited

U.S. PATENT DOCUMENTS

| | | | |
|---|---|---|---|
| 4,072,962 | 2/1978 | Maida | 354/51 X |
| 4,099,115 | 7/1978 | Watanabe | 354/60 R X |

Primary Examiner—L. T. Hix
Assistant Examiner—William B. Perkey
Attorney, Agent, or Firm—Schwartz, Jeffery, Schwaab, Mack, Blumenthal & Koch

[57] ABSTRACT

An arrangement for compensating the temperature coefficient of the semiconductor junction connected in a circuit, comprising first, second, and third transistors of the same predetermined type, each having a base-emitter junction and operatively connected to have a respective collector current, and a resistive voltage divider having two ends in a center tap. The transistors and the divider are operatively connected such that the voltages of the base-emitter junctions of the first and second transistors are summed and applied across the ends of the voltage divider. The voltage from one end to the center tap of the voltage divider is connected across the base-emitter junction of the third transistor. The collector current of the third transistor thus corresponds to the geometric mean of the respective collector currents of the first and second transistors and is substantially less temperature-dependent than the collector current of the first transistor. The arrangement is particularly useful in circuits for exposure measuring and control in photographic devices.

6 Claims, 2 Drawing Figures

CIRCUIT ARRANGEMENT FOR THE COMPENSATION OF THE TEMPERATURE COEFFICIENT OF SEMICONDUCTOR JUNCTIONS

BACKGROUND OF THE INVENTION

The invention concerns a circuit arrangement for the compensation of the temperature coefficient of semiconductor junctions.

It is known that the relationship between the collector current Ic and the base emitter potential $U_{BE}$ of a transistor is strongly temperature dependent and it is further known that this temperature coefficient is much larger with small collector currents than with higher collector currents.

This is of particular concern in the exposure measuring and control circuits of photographic devices, wherein the measurement or the control of the shutter, respectively, is effected by means of the flow of a very slight current produced by the incident light in a photoelectric cell. The effect has recently been gaining additional importance, because the photoelectric cells are becoming steadily more sensitive, i.e. they work with constantly declining illumination levels, yielding correspondingly lower signal currents.

The operating range of high performance photographic cameras at the present time frequently extends to an exposure value of Ev−1 at 21 DIN or even lower. This corresponds to a luminous density of 0.06 cd/m². Photographs of objects at night with a full moon are thus possible. Generally, cameras capable of measuring at such low luminances are equipped with Si photocell because CdS photo conductive cells, due to their sluggishness at low luminances, cannot be used in such cameras.

Si photo diodes produce at such low luminances signal currents of a few pA only. The measuring range is limited by the ratio of the signal current to the residual current.

When this ratio drops below an approximate factor of 10, accurate measurement of luminances is no longer possible. Because slight residual currents in particular are very strongly dependent on temperature, the range of measurements may be specified, strictly speaking, at a given temperature only.

It is, however, practically impossible for the user of such a high performance camera to decide, on the basis of brightness and temperature, whether an exposure is possible or not.

The use of highly-sensitive films and wide-opening lenses increases the danger that the user will make exposures below the minimum luminance, leading to incorrectly-exposed images. Thus, for example, with a luminance of 0.06 cd/m², a 36 DIN film, and a lens with an aperture of 1:1.4, the exposure would be 1/15 sec., i.e., an exposure which under certain conditions may be effected freely by hand. In other fields of applications of these high-performance cameras, for example, operations photography, and microscope photography, the minimum luminance is also reached very quickly and the user should in such case be warned.

There exists, however, the difficulty that the currents provided by the photo diode, because of their wide dynamic range, must be compressed. This is done, for example, with the aid of a transistor in a logarithmic circuit. Thereby arises the problem that the nearly temperature-independent photo cell current is converted into a base-emitter potential of a transistor, which is strongly dependent on temperature.

Such a circuit could be extended to include a warning device operable at the smallest permissible current level, by incorporating a comparator having one input supplied with the base-emitter potential $U_{BE}$ of the logarithmic transistor and another input provided with an adjusted potential from a voltage divider. This circuit has, however, the inherent disadvantage that its indication is correct only at the temperature for which it is has been balanced.

To obtain correct indications from such a warning device, it would be necessary to take the reference voltage not from a temperature-independent resistive divider, but from a divider having the same temperature dependence as the base-emitter of the logarithmic transistor at the smallest photocell current to be indicated. This may be effected either by means of an expensive network of thermistors and balancing trimmers for the reference voltage, requiring a relatively long time for balancing, or by taking the reference voltage from a semiconductor element of the type used in the logarithmic stage. The difficulty here lies in that the semiconductor element must be supplied with a current as small as the smallest photocell current to which the warning device is to respond. This is likewise very difficult to obtain. In addition, the comparator to be used would require a very high impedance input, for example, a FET input.

SUMMARY OF THE INVENTION

It is therefore an object of the invention to provide a circuit having a warning device which avoids the above-mentioned disadvantages.

The object is attained according to the invention by adding to the base-emitter junction voltage $U_{BE}$ of a transistor to be compensated the voltage $U_{BE}$ across the base-emitter junction of a second transistor of the same type, and applying this total voltage by means of a resistive voltage divider having a ratio of 1:1 across the base-emitter junction of a third transistor of the same type, so that the collector current of the third transistor will correspond to the geometric mean value of the collector currents of the first and the second transistor and be independent of temperature.

The advantages of this circuit are that, first, the photocell current is transformed into a current that is significantly larger and thus is more readily processed and, second, the collector current of the third transistor is independent of temperature.

It is desirable, however, that under certain conditions the collector current of the third transistor be not entirely independent of temperature. In the case of an exposure meter operating with Si photo diodes the residual currents of the photocell element strongly increase with rising temperatures. This signifies a shift of the minimum luminance for which the camera still operates with approximate accuracy to higher luminance values. A suitable warning device must be able to follow this shift with temperature of the minimum luminance. This may be obtained by imparting a certain temperature dependence to the collector current of the third transistor used for the activation of the warning device, which may be effected by a suitable dimensioning of the voltage divider. If the divider ratio is made asymmetrical, then any temperature coefficient desired may be set between the maximum temperature coefficient TK$_{max}$ of the first transistor and the minimum temperature coefficient TK$_{min}$ of the second transistor.

These and other features of the invention are illustrated and explained in greater detail in the following drawings and description of a preferred embodiment of an exposure meter and control device for a reflex camera with open diaphragm measuring the automatic timing.

THE PREFERRED EMBODIMENT

Figure 1:
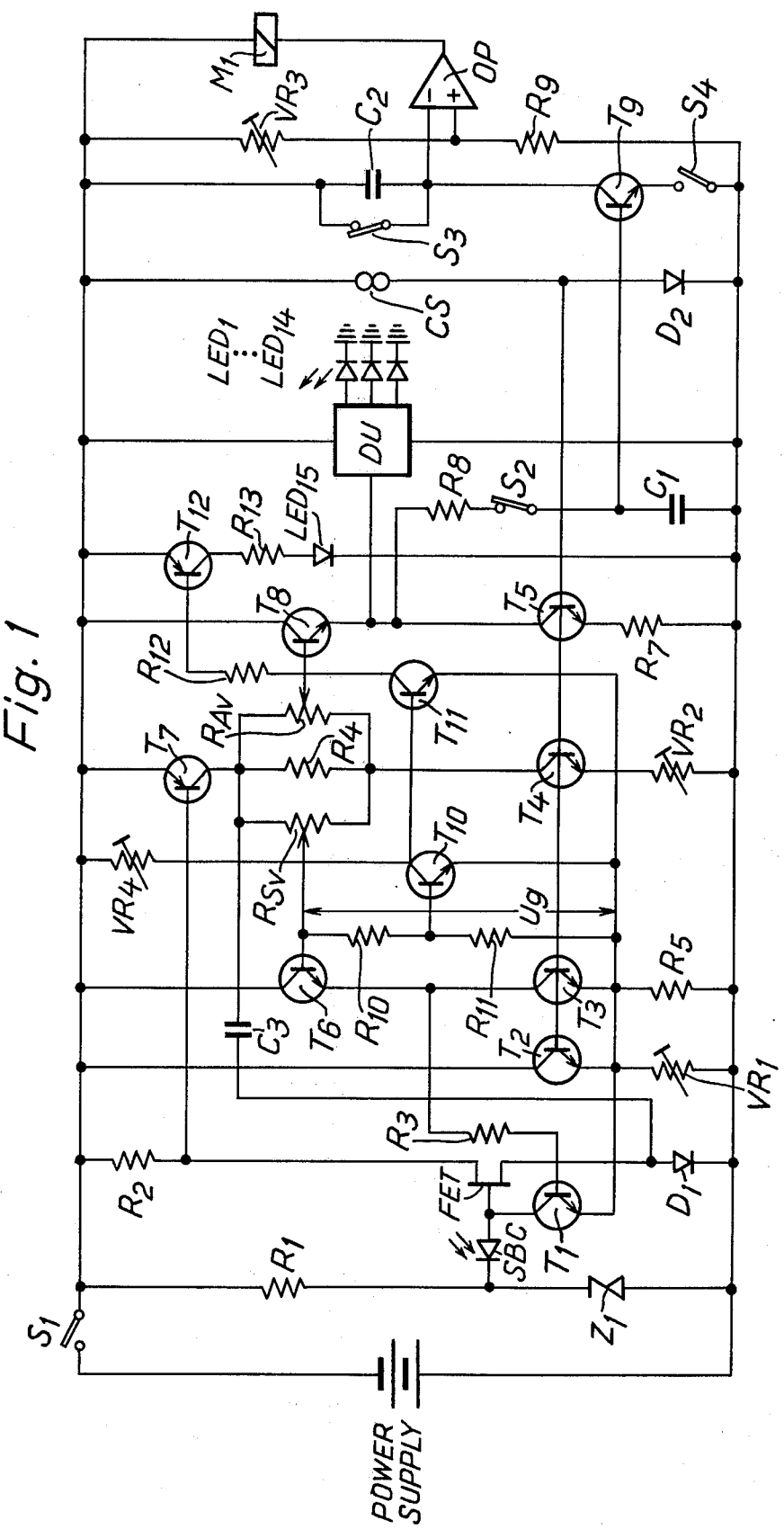
FIG. 1 shows the basic circuit diagram of a preferred embodiment of an exposure meter and shutter control device according to the invention.

In the circuit of FIG. 1, a resistor R1 in series with a Zener diode Z1 ensures a stabilized voltage at the cathode of a photo diode SBC.

The anode of the photo diode is applied to the gate of a field effect transistor FET. A diode D1 provides for a predetermined bias voltage at the source connection of the FET.

Logarithmic transistor T1 draws current from the photodiode SBC. The base-emitter voltage of T1 is proportional to the logarithm of the photo-diode current.

Transistors T2 and T5 act as a current source. The base connections of these transistors are connected to one another and to the anode of a diode D2. Current from a source of current CS is impressed on diode D2. Because transistors T2-T5 are all of the same type and have essentially the same characteristics, the collector currents of these transistors are inversely proportional to the values of emitter resistors VR1, R5 VR2, and R7.

C1 is a storage capacitor, coupled by means of a switch contact S2 and a resistor R8 to the emitter of a transistor T8.

Timing control transistor T9, following the opening of short-circuit switch contact S3 and the closing of starting switch contact S4, charges a timing condenser C2 by means of its collector current. Comparator OP has its non-inverting input connected to a voltage divider consisting of series-connected resistances VR3 and R9, and having its inverting input connected to the timing condenser C 2. The coil of a holding electromagnet M1, which controls the second shutter process in a manner explained further below is connected to the output of comparator C 2.

Resistors R$_{Sv}$ and R$_{Av}$ are the resistances for the input of the film sensitivity (DIN or ASA) and the preselected aperture (f-stop), respectively.

Indicating diodes for the times (LED1 ... LED14) are connected to the outputs of an indicator unit DU.

The manner of operation of the circuit is as follows.

Upon depressing the shutter release trigger, switch contact S1 is closed, and voltage is thus applied to the entire circuit. A voltage, corresponding to the Zener potential of the Zener diode Z1, is then established at the cathode of the photo diode SBC.

The current generated by the photo diode SBC, which is directly proportional to the intensity of illumination striking the photo diode, flows from the anode of the photo diode by way of the collector of T1, trimmer resistor VR1, and Zener diode Z1, back to the cathode of photo diode SBC. In the process, a base emitter voltage is established across transistor T1, which is proportional to the logarithm of the current.

The base of transistor T1 is coupled by resistor R3 to the emitter of transistor T6. The emitter current of transistor T6 is regulated by current source T3, so that a constant base-emitter voltage is established across transistor T6 at constant temperature.

The tap of the DIN (film sensitivity) potentiometer R$_{Sv}$ is connected to the base of transistor T6. The voltage difference between the collectors of transistor T4 and T7 is constant, resulting from the three parallel-connected resistors (R$_{Sv}$, R$_{Av}$, R4) and resulting from the collector current of T4. The collector current of T4 is set so that a change in the position of the wiper of resistor R$_{Av}$ by the equivalent of one f-stop or that of resistor R$_{Sv}$ by the equivalent of 3DIN results in a change in potential of 18 mV at room temperature. This potential may float within a wide range between negative and positive potentials. The reference point for this voltage is the potential at the base of transistor T6.

The voltage at the collector of transistor T7 thus represents information concerning luminance, diaphragm aperture (f-stop) and film sensitivity (DIN number). A voltage proportional to the number of aperture settings (f-stops) between the largest possible aperture and the selected aperture setting attained after triggering is subtracted from the voltage at the collector of transistor T7 with the aid of potentiometer R$_{Av}$.

The emitter current of transistor T8 is supplied by current source T5 so that a constant base-emitter voltage is established across transistor T8, provided that the temperature remains constant.

The voltage at the emitter of transistor T8 is transferred by means of the resistor R8 to storage capacitor C1.

The potential balance at this point then is as follows:

$$U_{VR1} + U_{BET1} + I_{B1} \cdot R3 + U_{BET6} + U_{Sv} - U_{Av} - U_{BET8} = U_{C1}$$

where $U_{VR1}$ is the voltage across resistor VR1,
$U_{BET1}$ is the base-emitter voltage across transistor T1,
$I_{B1}$ is the base current of transistor T1,
$U_{BET6}$ is the base-emitter voltage across transistor T6,
$U_{Sv}$ is the voltage from the center tap of resistor R$_{Sv}$ to the collector of transistor T7,
$U_{Av}$ is the voltage from the center tap of resistor R$_{Av}$ to the collector of transistor T7,
$U_{BET8}$ is the base-emitter voltage across transistor T8, and $U_{C1}$ is the voltage applied across capacitor C1.

The voltage $I_{B1} \cdot R3$ may be neglected, because even when the collector current of transistor T1 is high (maximum approximately 10μ A), only a very small base current $I_{B1}$ flows, due to the high gain of transistor T1.

When transistors T6 and T8 are of the same type and have substantially equal emitter currents, then the base-emitter voltages of transistors T6 and T8 are equal and cancel each other in the equation, given above.

Further, $U_{Bv} - U_{AVo}$ may be substituted for $U_{BET1}$, the expression representing a voltage proportional to the logarithm of the luminance to be measured ($U_{Bv}$), reduced by the transparency of the lens ($U_{Avo}$). Then $$U_{VR1} + U_{Bv} - U_{Ao} + U_{Sv} - U_{Av} = U_{C1} = U_{BET9}$$

where $U_{BET9}$ is the base-emitter voltage across transistor T9.

Setting $U_{BET9} = U_{Tv}$ and combining the expression $U_{AVo} + U_{Av} = U_{Av}'$ yields $$U_{VR1} + U_{Bv} + U_{Sv} - U_{Av} = U_{Tv}$$

This equation is directly analogous, with the exception of the expression $U_{VR1}$ to the known exposure equation in the APEX system of:

$$B_v + S_v = A_v + T_v$$

wherein $B_v$ = a voltage proportional to the brightness of the object, $S_v$ = a voltage proportional to the sensitivity of the film, $A_v$ = a voltage proportional to the diaphragm opening, and $T_v$ = a voltage proportional to the exposure time.

The additional voltage $U_{VR1}$ results in a shift of the operating range of transistor T9 to higher collector currents. Transistor T9 is an antilogarithmic element. The voltage $U_{BET9} = U_{CI}$ across the base-emitter junction of transistor T9 results in a collector current through T9 following the triggering and closing of the starting switch contact S4, this collector current charging the timing capacitor C2. When the voltage at the inverting input of comparator OP reaches the magnitude of the voltage at the non-inverting input, the output of comparator OP reverses polarity and blocks the flow of current through the coil of holding electromagnet M1. This releases a second shutter curtain which in turn closes the image aperture.

The basic circuit described above is supplemented with a warning device which, in keeping with the invention, affords temperature compensation. For this purpose, a voltage divider R10/R11 is connected between the base of transistor T6 and the emitter of transistor T1. The base of transistor T10 is coupled to the connecting point of the two resistances, i.e., to the center tap of the voltage divider. The emitter of transistor T10 is connected to the emitter of transistor T1, while the collector of transistor T10 is coupled by variable resistor VR4 to the positive power supply terminal. The base of transistor T11 is also connected to the collector of T10, while the emitter of transistor T11 is joined with the emitter of transistor T10. The collector of transistor T11 controls, by means of resistor R12, the base of the transistor T12, the collector circuit of the latter having a current-limiting resistor R13 and a warning device comprising a light-emitting diode LED 15.

As may be seen, the current $I\phi$ supplied by the photo diode SBC is completely taken over by transistor T1, so that $I_{CI} = I\phi$.

The following relationship exists between the collector current $I_C$ and the base-emitter voltage $U_{BE}$ of a transistor:

$$I_C = I_S \cdot e^{(q \cdot U_{BE})/(k \cdot T)}$$

or with $U_T = (k \cdot T/q)$ $$I_C = I_S \cdot e^{U_{BE}/U_T},$$

wherein $I_S$ = reverse saturation current of the base-emitter junction q = elementary charge k = Boltzmann constant T = absolute temperature $U_T$ = thermal voltage Resolving the last-mentioned equation for $U_{BE}$ yields $$U_{BE} = U_T \ln I_C/I_S$$

The base-emitter voltage of transistor T1 is thus directly proportional to the logarithm of the photocell current.

In order to activate a warning device to indicate the lower limit of the measuring range, the luminance signal must be tapped and compared with a reference value.

The luminance signal in the circuit of FIG. 1 is present in the form of the base-emitter voltage of transistor T1. However, this voltage is highly temperature-dependent, as indicated by the characteristic curves of FIG. 2. This dependence on temperature could be rendered ineffective by imparting to the reference voltage the temperature dependence of the base-emitter junction. This is fundamentally possible, for example, with a network of temperature-dependent resistances, but is relatively costly if the temperature dependence is to be simulated with even approximate accuracy. Another possibility is to generate the reference voltage by feeding a current into a semiconductor junction such as, for example, a second transistor. But because of the variation of the temperature coefficient of the base-emitter voltage $U_{BE}$ with the collector current, this has the disadvantage that the reference current must be as small as the smallest signal current, i.e., a few pA.

The adjustment of such a small current likewise requires relatively costly electrical equipment and there is great danger of interference with this current from electrical or magnetic effects.

The necessary temperature compensation is attained according to the invention in a much simpler manner.

If not only the base-emitter voltage of transistor T1 but also the voltage between the base of transistor T6 and the emitter of transistor T1 is employed to activate the warning device, and if a voltage divider comprising two resistors of equal value (R10 and R11) is connected across the latter voltage, then a voltage $$U_{BET10} = \frac{U_{BET1} + U_{BET6}}{2}$$

will be provided across the base-emitter junction of transistor T10. Voltage $U_{BET10}$ includes the luminance signal with only one-half sensitivity, because the base-emitter voltage $U_{BE}$ of transistor T6 is constant as the result of the regulation of the collector current $I_C$ of transistor T6.

Forward biasing of transistor T10 with voltage $U_{BET10}$ yields a collector current $I_{CT10}$ of $$U_{BET10} = \frac{U_{BET1} + U_{BET6}}{2} \quad (1)$$

with $$U_{BET1} = U_T \ln \frac{I_{CT1}}{I_S} \quad (2)$$

$$U_{BET6} = U_T \ln \frac{I_{CT6}}{I_S} \quad (3)$$

-continued $$U_{BET10} = U_T \ln \frac{I_{CT10}}{I_S} \quad (4)$$

Ths substitution of Equations (2) and (3) into Equation (1) yields $$\frac{U_T \ln \frac{I_{CT1}}{I_S} + U_T \ln \frac{I_{CT6}}{I_S}}{2} = U_T \ln \frac{I_{CT10}}{I_S}$$

Because all three transistors (T1, T6 and T10) are similar:

$$U_{T1} = U_{T6} = U_{T10} = U_T \text{ and } I_{ST1} = I_{ST6} = I_{ST10} = I_S$$

$$\tfrac{1}{2} U_T \left( \ln \frac{I_{CT1}}{I_S} + \ln \frac{I_{CT6}}{I_S} \right) = U_T \ln \frac{I_{CT10}}{I_S}$$

$$\tfrac{1}{2} U_T (\ln I_{CT1} - \ln I_S + \ln I_{CT6} - \ln I_S) = U_T (\ln I_{CT10} - \ln I_S)$$

$$\tfrac{1}{2} \ln I_{CT1} \cdot I_{CT6} - \ln I_S = \ln I_{CT10} - \ln I_S$$

$$\tfrac{1}{2} \ln I_{CT1} \cdot I_{CT6} = \ln I_{CT10}$$

$$I_{CT10} = \sqrt{I_{CT1} \cdot I_{CT6}}$$

Thus, the collector current $I_{CT10}$ of transistor T10 corresponds to the geometric mean of the two currents $I_{CT1}$ and $I_{CT6}$ and is completely independent of temperature, because all of the temperature-dependent parameters, such as $U_T$ and $I_S$, are mutually eliminated.

When, for example, the photocell current at the limit of the measuring range is $I = I_{CT1} = 40$ pA and current $I_{CT6} = 10\mu A$, then transistor T10 has a collector current of $$I_{CT10} = \sqrt{40 \cdot 10^{-12} \cdot 10 \cdot 10^{-6}}$$

$$I_{CT10} = 20 \text{ nA}$$

If the trimmer resistance VR 4 is adjusted so that with this current the transistor T11 is still blocked an the light-emitting diode LED15 therefore emits no light, then the further reductions of the luminance the base-emitter voltage $U_{BE}$ of transistor T10 declines so that the collector current $I_{CT10}$ becomes smaller; because of the reduced voltage drop across VR4 transistor T11 is rendered conductive and LED15 is caused to light up by means of transistor T12.

Figure 2:
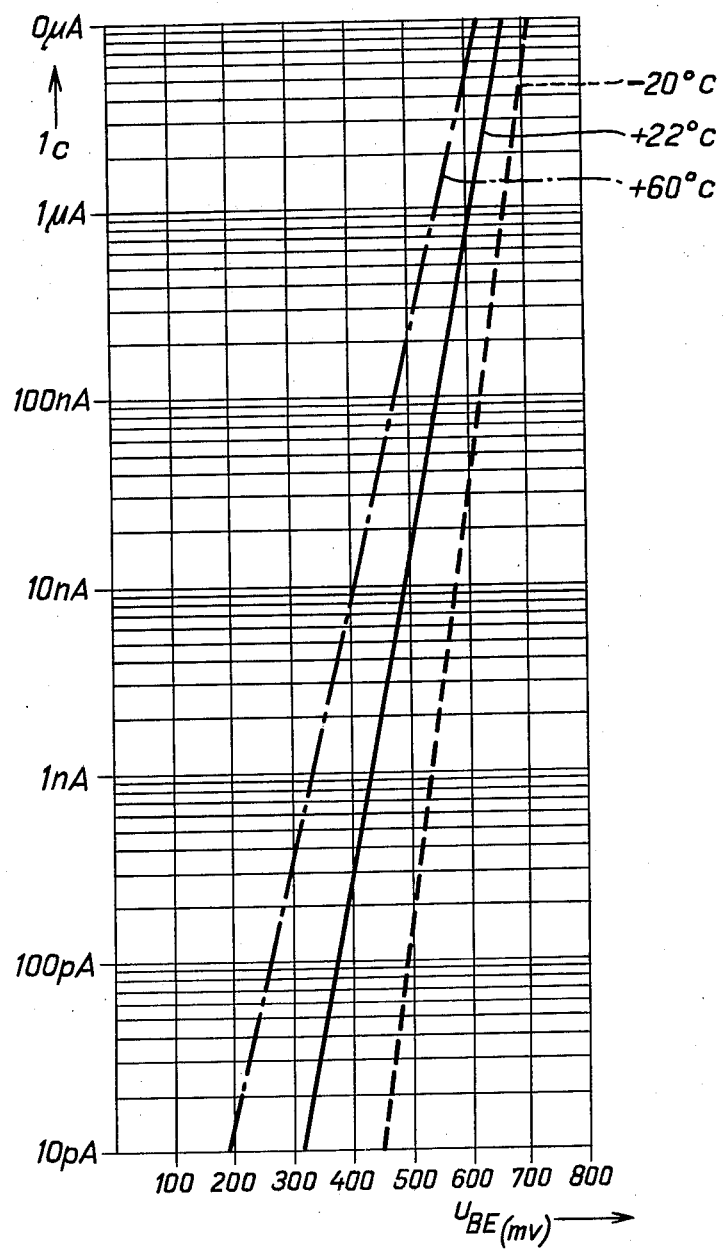
FIG. 2 shows characteristic curves Ic/U$_{BE}$ of a transistor at differing temperatures.

As can be seen from FIG. 2, temperature changes have no effect whatsoever on the limits of the indication of LED15, because the collector current of transistor T10 is symmetrical with respect to currents $I_{CT1}$ and $I_{CT6}$. That is, for example, when $I_{CT1} = 40$ pA, and $I_{CT6} = 10\mu A$, then $I_{CT10} = 20$ nA. If, in this example, a change in temperature from $+22°$ C. to $+60°$ C. is assumed, the base-emitter voltage of transistor T6 ($U_{BET6}$) is shifted by about $-45$ mV and the base-emitter voltage of transistor T1 ($U_{BET1}$) is shifted by about $-115$ mV. This means that the base-emitter voltage $U_{BE}$ of transistor T10 changes by the mean value of $$-\frac{115 + 45}{2} = -80 \text{ mV}$$

As can be seen from FIG. 2, the collector current $I_{CT10}$ remains constant with a change in $U_{BET10}$ of $-80$ mV, during the abovementioned change in temperature.

As mentioned earlier, the limit of the measuring range is strictly valid only for a given temperature, for example, room temperature. With rising temperatures, the residual currents of the Si element increase so that then the upper limit of the measuring range corresponds to a higher luminance.

If it is desired to take into consideration that shift of the warning limit with temperature, this may be accomplished in the circuit of FIG. 1 in the following manner:

If the voltage between the base of T6 and the emitter of T1 is divided not in a ratio of 1:1, but approximately $$R10/R11 \approx 0.8/1$$

then because of the higher base-emitter voltage of T10 and upon reaching the limit of the measuring range, a collector current $I_{CT10}$ higher than in the case of the symmetrical division of the voltage will result.

With rising temperatures, the two base-emitter voltages of T1 and T6 are shifted in accordance with the characteristic curve in FIG. 2.

However, because the voltage divider R10/R11 is independent of temperature, this unsymmetrical division at high temperatures results in a base-emitter voltage $U_{BE}$ for transistor T10 corresponding to a smaller collector current than at room temperature.

The following example is intended to demonstrate this condition:

At room temperature (20° C.), for a current of

| $I_{CT6} = 10 \mu A$ | → | $U_{BET6} = 665$ mV |
| $I_{CT1} = 40$ pA | → | $U_{BET1} = 355$ mV |
| | | $U_g = 1020$ mV |

If this voltage is divided in the ratio of $$R10/R11 = 0.8/1.0$$

then the base-emitter voltage across transistor T10 will be $$U_{BET10} = U_g \cdot \frac{R11}{R10 + R11} = 1020 \text{ mV} \frac{1.0}{0.8 + 1.0} = 567 \text{ mV}$$

As seen from FIG. 2, $U_{BET10} = 567$ mV corresponds to a collector current of $I_{CT10} = 200$ nA.

The warning device is set to activate at this current level by means of adjusting resistor VR4.

If now the temperature rises to 60° C., the base-emitter voltage varies by $$I_{CT6} = 10 \mu A \rightarrow U_{BET6} = 623 \text{ mV}$$

$$I_{CT1} = 40 \text{ pA} \rightarrow \frac{U_{BET1} = 237 \text{ mV}}{U_g = U_{total} = 860 \text{ mV}}$$

A base-emitter voltage of $$U_{BET10} = 860 \text{ mV} \frac{1}{0.8 + 1} = 478 \text{ mV}$$

is then obtained across transistor T10 with the ratio of divider R10/R11 unchanged.

This base-emitter voltage, however, now corresponds to a collector current of $I_{CT10} = 100$ nA; i.e., the collector current is diminished with this rise in temperature by a factor of 2 or, expressed differently, the warning device is activated at a higher photocell current.

I claim:

1. An arrangement for compensating a temperature coefficient of a semiconductor junction connected in a circuit comprising:

first, second, and third transistors of the same predetermined type, each having a base-emitter junction;

means operatively connected to said transistors for providing a respective collector current; and a resistive voltage divider having two ends and a center tap, wherein said transistors and said divider are operatively connected such that the voltages of the base-emitter junctions of the first and second transistors are summed and applied across the ends of said voltage divider, the voltage from one said end to said center tap connected across the base-emitter junction of said third transistor, whereby the collector current of said third transistor corresponds to a geometric mean of the respective collector currents of said first and second transistors and is substantially less temperature-dependent than the collector current of said first transistor.

2. The arrangement of claim 1, wherein a ratio of the resistances between the center tap and the respective ends of said voltage divider is 1:1, whereby the collector current of said third transistor is substantially independent of temperature.

3. The arrangement of claim 1, wherein said voltage divider is asymmetrical and is connected such that the collector current of said third transistor is related to a predetermined temperature coefficient dependent on the divider ratio of said voltage divider.

4. The arrangement of claim 3, wherein said predetermined temperature coefficient is adjustable between limiting values of respective temperature coefficients of the first and second transistor base-emitter junctions.

5. The arrangement of claims 1, 2, 3, or 4, wherein the base of said first transistor is coupled to the emitter of said second transistor, the base of said second transistor is coupled to one end of said voltage divider, the base of said third transistor is coupled to the center tap of said voltage divider, and the other end of said voltage divider is coupled to the emitters of said first and third transistors.

6. The arrangement of claim 5, wherein said circuit comprises an exposure measuring and control circuit for a photographic device, further comprising:

a photoelectric element connected for providing the collector current of said first transistor; and circuit means coupled to the base of said second transistor for controlling a shutter of said photographic device, said circuit means having manually-adjustable means for input of aperture and film sensitivity information.

* * * * *